(12) United States Patent
Mitsuhashi (10) Patent No.: US 7,508,217 B2
(45) Date of Patent: Mar. 24, 2009

(54) TEST APPARATUS AND TEST MODULE

(75) Inventor: Naofumi Mitsuhashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/025,464

(22) Filed: Feb. 4, 2008

(65) Prior Publication Data
US 2008/0116899 A1    May 22, 2008

Related U.S. Application Data

(63) Continuation of application No. 11/603,958, filed on Nov. 22, 2006, now abandoned.

(51) Int. Cl.
*G01R 31/02* (2006.01)
*G01R 31/26* (2006.01)

(52) U.S. Cl. ................... 324/537; 324/765

(58) Field of Classification Search ......... 324/537, 324/750, 763, 765, 500, 527, 76.11, 607, 324/120; 702/85, 108, 117, 126
See application file for complete search history.

(56) References Cited

U.S. PATENT DOCUMENTS

| | | | |
|---|---|---|---|
| 5,883,523 A * | 3/1999 | Ferland et al. ............... | 324/765 |
| 6,427,096 B1 * | 7/2002 | Lewis et al. ................. | 700/228 |
| 6,737,760 B2 * | 5/2004 | Jenni ............................ | 307/31 |
| 6,987,387 B2 * | 1/2006 | Kokubu et al. ............. | 324/522 |
| 7,409,617 B2 * | 8/2008 | Almy et al. .................. | 714/738 |
| 2006/0220938 A1 * | 10/2006 | Leung et al. ................ | 341/155 |
| 2008/0091371 A1 * | 4/2008 | Ishida et al. ................. | 702/89 |

FOREIGN PATENT DOCUMENTS

| | | |
|---|---|---|
| JP | 9-26468 | 1/1997 |
| JP | 2003-194887 | 7/2003 |
| JP | 2005-91206 | 4/2005 |

OTHER PUBLICATIONS

International Search Report for International Application No. PCT/JP2007/072227, mailed on Feb. 12, 2008, (6 pages).

* cited by examiner

*Primary Examiner*—Vincent Q Nguyen
*Assistant Examiner*—Hoai-An D Nguyen
(74) *Attorney, Agent, or Firm*—Osha • Liang LLP (57) ABSTRACT

A test apparatus is provided. The test apparatus includes: a signal provision section that provides a test signal to a device under test; an input section that inputs the output signal outputted from the device under test in response to the test signal as a signal-under-test; a periodic pulse generating section that generates a periodic pulse having a pulse width corresponding to one cycle of the signal-under-test; a converting section that outputs a voltage corresponding to the width of periodic pulse; an AD converter that converts a voltage to a digital voltage value; a pulse width calculating section that calculates a digital pulse width indicative of the width of the periodic pulse based on the digital voltage value; and an adjusting section that adjusts a conversion parameter that converts between the digital voltage value and the digital pulse width.

15 Claims, 6 Drawing Sheets

TEST APPARATUS AND TEST MODULE

CROSS-REFERENCE TO RELATED APPLICATIONS

This is a continuation of U.S. patent application Ser. No. 11/603,958 filed on Nov. 22, 2006.

BACKGROUND

1. Field of the Invention

The present invention relates to a test apparatus and a test module. Particularly, the present invention relates to a test apparatus that tests a device under test such as a semiconductor circuit and a test module that is provided in the test apparatus.

2. Related Art

There is an apparatus that measures a plurality of device under tests at a time as a test apparatus that tests a device under test such as a semiconductor circuit. For example, the apparatus measures an output signal outputted from each device under test in parallel by a plurality of channels. For example, a level comparator that compares the level of the output signal with a reference value and an operation circuit are packaged for each channel of a testing board such as a mother board, so that the output signal for each device under test can be measured.

However, various circuits such as a circuit that generates a test signal and provides the same to the device under test, and a circuit that generates a clock signal and provides the same to the device under test are provided on the testing board. Therefore, the packaging density and the space on the testing board are limited, so that it is difficult to package a testing circuit for each channel.

Additionally, when the testing circuit is packaged for each channel, it is different to ensure the accuracy of measurement for each channel because the components are different between each measuring circuit.

Thus, the advantage of the present invention is to provide a test apparatus and a test module which are capable of solving the problem accompanying the conventional art. The above and other advantages can be achieved by combining the features recited in independent claims. Then, dependent claims define further effective specific example of the present invention.

SUMMARY

In order to solve the above described problems, a first aspect of the present invention provides a test apparatus that tests a device under test. The test apparatus includes: a signal provision section that provides a test signal to a device under test; an input section that inputs the output signal outputted from the device under test in response to the test signal as a signal-under-test; a periodic pulse generating section that generates a periodic pulse having a pulse width corresponding to one cycle of the signal-under-test; a converting section that outputs a voltage corresponding to the width of periodic pulse; an AD converter that converts a voltage to a digital voltage value; a pulse width calculating section that calculates a digital pulse width indicative of the width of the periodic pulse based on the digital voltage value; and an adjusting section that adjusts a conversion parameter that converts between the digital voltage value and the digital pulse width.

A second aspect of the present invention provides a test module provided in a test head of a test apparatus that tests a device under test. The test module includes: an input section that inputs an output signal outputted from a device under test through a mother board placed on a test head as a signal-under-test; a periodic pulse generating section that generates a periodic pulse having a pulse width corresponding to one cycle of the signal-under-test; a converting section that outputs a voltage corresponding to the width of periodic pulse; an AD converter that converts a voltage to a digital voltage value; a pulse width calculating section that calculates a digital pulse width indicative of the width of the periodic pulse based on the digital voltage value; and an adjusting section that adjusts a conversion parameter that converts between the digital voltage value and the digital pulse width.

Here, all necessary features of the present invention are not listed in the summary of the invention. The sub-combinations of the features may become the invention.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
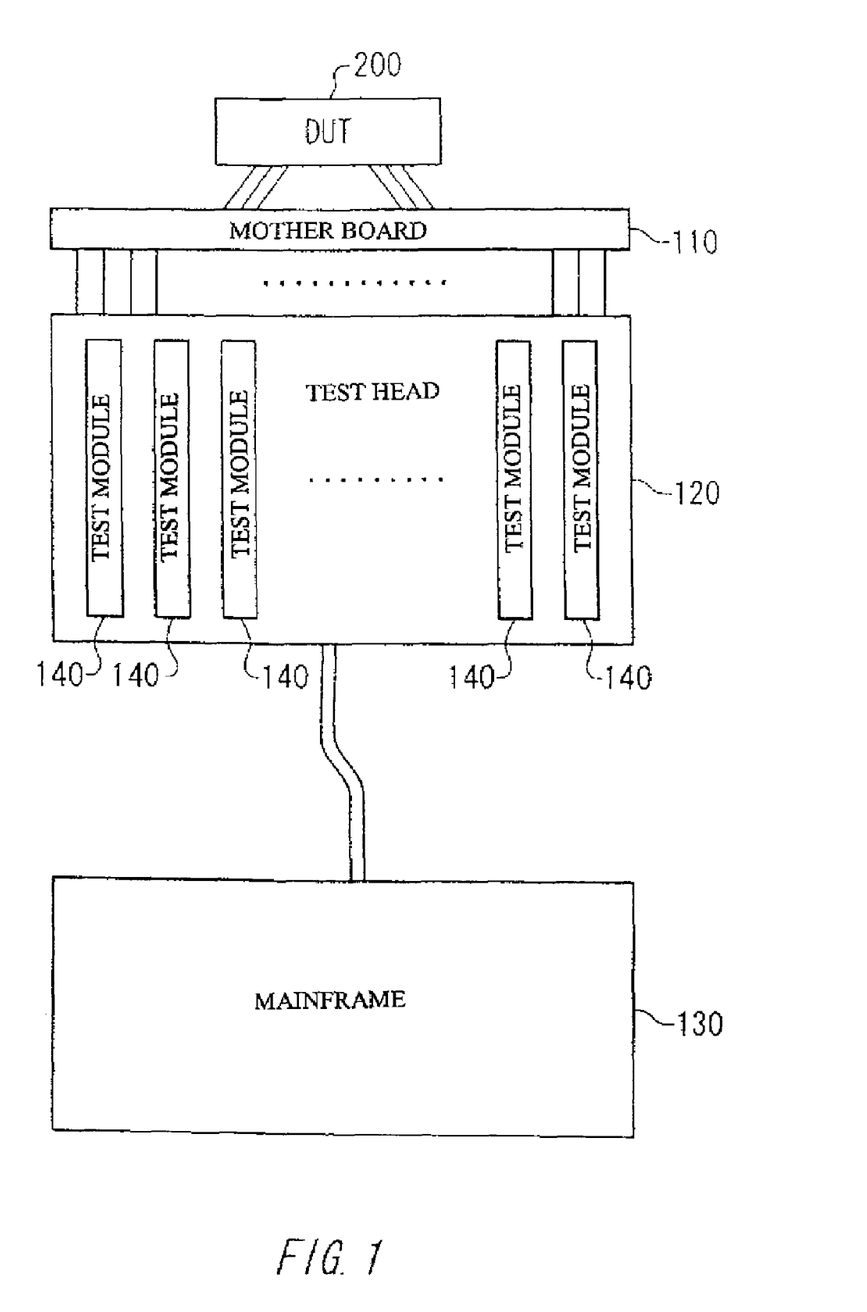
FIG. 1 shows an example of configuration of a test apparatus 100 according to an embodiment of the present invention.

FIG. 1 shows an example of configuration of a test apparatus 100 according to an embodiment of the present invention. The test apparatus 100 having a mother board 110, a test head 120 and a mainframe 130 that tests a device under test 200 such as a semiconductor circuit. The device under test 200 is placed on the mother board 110. The mother board 110 has a plurality of device side terminals which are electrically connected to each input/output pin of the device under test. The mother board 110 has a plurality of tester side terminals which are electrically connected to the test head 120.

The mother board 110 is placed on the test head 120. A plurality of test modules 140 are also placed on the test head 120. Each of the test modules 140 is electrically connected to the tester side terminal of the mother board 110 and transmits/receives signals to/from the device under test 200. For example, the test module 140 that provides a test signal to the device under test 200 through the mother board, and the test module 140 that receives the output signal from the device under test 200 through the mother board may be placed on the test head 120. By measuring an output signal for the predetermined test signal provided to the device under test 200, the device under test 200 can be tested.

The mainframe 130 is connected to the test head 120 by such as an optical cable and a coaxial cable. The mainframe 130 may output a control signal that controls each of the test modules 140. Additionally, the mainframe 130 may receive a result obtained by measuring the output signal of the device under test.

Figure 2:
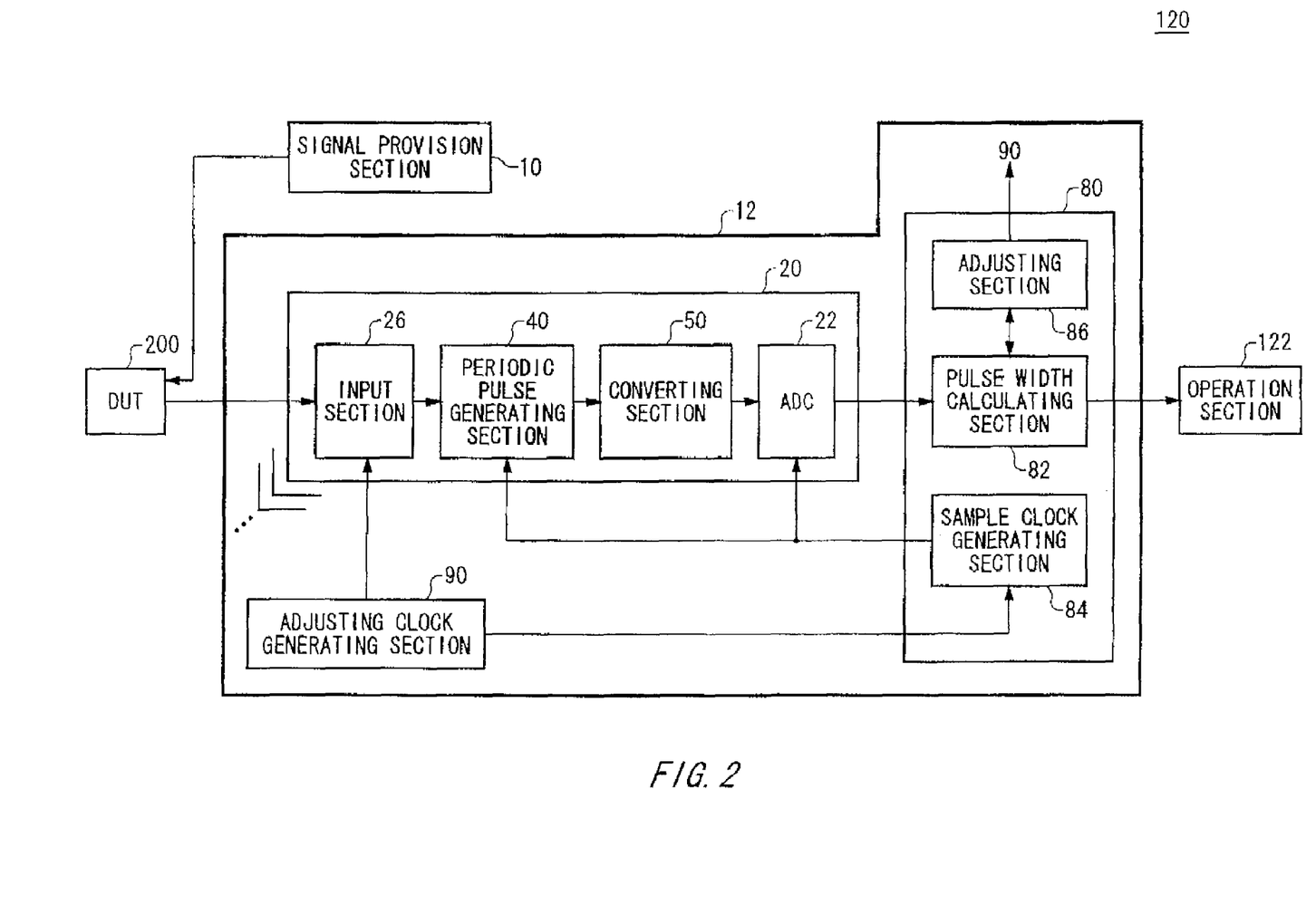
FIG. 2 shows an example of configuration of a circuit provided on a test head 120.

FIG. 2 shows an example of configuration of a circuit provided on a test head 120. Here, the motherboard 110 and the mainframe 130 are omitted in FIG. 2.

The test head 120 includes a signal provision section 10, a measurement circuit 12 and an operation section 122. The signal provision section 10 generates a test signal to test the device under test 200 and provides the same to the device under test 200. For example, the signal provision section 10 may provide a test pattern signal having a predetermined logic pattern signal and a source power.

A measurement circuit 12 measures the output signal from the device under test 200. The measurement circuit 12 has a plurality of measurement channels. For example, the measurement circuit 12 may have a plurality of measurement channels each of which measures the output signal from the device under test 200. Additionally, the measurement circuit 12 may have a plurality of measurement channels each of which measures the output signals from the device under test and also may have a plurality of measurement channels each of which measures the output signals from a plurality of output pins of the device under test. There may be a plurality of signal provision sections 10 corresponding to the plurality of measurement channels.

Each of the signal provision section 10 and the measurement circuit 12 may be provided in the different test modules 120 as shown in FIG. 1, or may be provided in the same test module 140. Additionally, the measurement circuit 12 may have the test module 140 for each of the plurality of measurement channels. The signal provision section 10 may provide in the test module 140 in the corresponding to the measurement channel.

The measurement circuit 12 has a circuit for each channel 20, a data processing section 80 and an adjusting clock generating section 90. The circuit for each channel 20 is provided for each of the measurement channels. That is, the circuit for each channel 20 is provided for each of the output signals to be measured. The circuit for each channels 20 may be provided for each of the plurality of test modules 140 corresponding to the plurality of measurement channels.

Each of the plurality of circuit for each channels 20 has a data processing section 80 and an adjusting clock generating section 90, respectively. That is, each of the data processing section 80 and the adjusting clock generating section 90 is provided as a common circuit for a plurality of measurement signals to be measured. Each of the data processing section 80 and the adjusting clock generating section 90 may be provided for each of the circuit for each channels 20. Additionally, when the plurality of circuit for each channels 20 are divided into a plurality of groups, each of the data processing section 80 and the adjusting clock generating section 90 may be provided for each group.

Each of the circuit for each channels 20 has an input section 26, a periodic pulse generating section 40, a converting section 50 and an AD converter 22. The input section 26 receives output signals outputted from the corresponding device under test 200 or the output pins of the corresponding device under test 200. The input section 26 inputs the received output signal to the circuit for each channel 20 as a signal-under-test. For example, the input section 26 may compare the level of the output signal at the timing of the provided clock signal with a predetermined reference value, and input the comparison result as the signal-under-test. For example, the input section 26 may input the comparison result as the signal-under-test, which indicates H logic when the level of the output signal at the timing of the clock signal is higher than the reference value and L logic when the level of the output signal at the timing of the clock signal is lower than the reference value.

The periodic pulse generating section 40 generates a periodic clock having a pulse width corresponding to one period of the signal-under-test in response to a sample clock which designates the timing at which the signal-under-test is sampled. An example of operation of the periodic pulse generating section 40 will be described later with reference to FIG. 4. That is, the periodic pulse generating section 40 outputs each period in a cycle of the signal-under-test designated by the sample clock, respectively as the amount of time indicated by the pulse width.

The converting section 50 outputs a voltage corresponding to the width of the periodic pulse. For example, the converting section 50 may output the voltage based on the result obtained by integrating the periodic pulse. That is, the converting section 50 converts the amount of time indicated by the pulse width of the periodic clock outputted by the periodic pulse generating section 40 to an analog voltage. The voltage is corresponded to the value for each period in the cycle of the signal-under-test designated by the sample clock, respectively.

The AD converter 22 converts the analog signal outputted by the converting section 50 to a digital voltage value. That is, the AD converter 22 outputs the digital voltage value corresponding to the value for each period in the cycle of the signal-under-test designated by the sample clock, respectively. The AD converter 22 may convert the analog voltage at the timing of the provided sample clock to a digital voltage value, and output the same.

As described above, the period in a predetermined cycle of the signal-under-test in each measurement channel can be measured. Thereby a periodic jitter of the signal-under-test can be obtained.

The data processing section 80 receives the digital voltage value outputted by each of the circuit for each channels 20 and performs a processing dependent on the digital voltage value. For example, the data processing section 80 may be a FPGA (Field Programmable Gate Array). In this case, the data processing section may perform a predetermined processing set in the FPGA.

The data processing section 80 according to the present embodiment includes a pulse width calculating section 82, an adjusting section 86 and a sample clock generating section 84. The operation of each of the pulse width calculating section 82, the adjusting section 86 and the sample clock generating section 84 may be previously set in the FPGA. The sample clock generating section 84 generates a sample clock having a predetermined period and provides the same to the periodic pulse generating section 40 and the AD converting section 22.

The pulse width calculating section 82 calculates a digital pulse width indicative of the width of the corresponding periodic pulse based on the digital voltage value outputted from each of the circuit for each channels 20.

That is, the converting section 50 converts the value on the to axis to the value on the voltage axis and inputs the same to the AD converter 22 in order to detect the value for a period of a predetermined cycle of the signal-under-test by the AD converter 22. Then, the pulse width calculating section 82 converts the digital value on the voltage axis outputted by the AD converter 22 to the digital value (digital voltage value) on the time axis.

The pulse width calculating section 82 may use a conversion parameter to convert each digital value on the voltage axis (digital voltage value) to the digital value on the time axis (digital pulse width). For example, the conversion parameter may be a coefficient by which the digital value for each voltage value is multiplied to calculate the digital value on the time axis. Additionally, the conversion parameter may be a mathematical expression for which each digital value of the voltage axis is substituted to calculate the digital value on the time axis. Additionally, the conversion parameter may be a table indicating whether each digital value on the voltage axis should be converted to which digital value on the time axis.

The adjusting section 86 adjusts the conversion parameter used to convert from the digital value on the voltage axis (digital voltage value) to the digital value of the time axis (digital pulse value) by the pulse width calculating section 82. For example, the adjusting section 86 may individually adjust the conversion parameter for each of the circuit for each channels 20. By above-described processing, the characteristic difference among the measurement channels can be compensated to accurately measure the periodic jitter of the signal-under-test. The adjusting section 86 may previously measure the characteristic for each measurement channel and adjust the conversion parameter based on the measurement result.

When the characteristic of the measurement channel is previously measured, the adjusting clock generating section 90 sequentially provides a plurality of adjusting clocks of which periods are different from each other to the input section 26 of the circuit for, each channels 20 to be measured. In this case, the input section 26 inputs the plurality of adjusting clocks instead of the output signal of the device under test 200 as the signal-under-tests. The adjusting clock generating section 90 may be provided in the FPGA on which the data processing section 80 is provided.

the adjusting section 86 sets the conversion parameter to the plurality of adjusting clock in the pulse width calculating section 82 such that if the adjusting clocks are inputted to the input section 26, the digital voltage value measured by the AD converter 22 is converted to the digital pulse width corresponding to one period of the adjusting clock in the pulse width calculating section 82.

The adjusting clock generating section 90 may notify the adjusting section of the value of one period for each adjusting clock. Additionally, controlling the value of one period for the adjusting clock to be generated by the adjusting clock generating section 90, the adjusting section 86 may calculate the value of one period for each adjusting clock based on the control signal provided to the adjusting clock generating section 90. An example of operation of the adjusting section 86 will be described later with reference to FIG. 6.

By the above-described processing, the difference for each measurement channel is compensated, so that each signal-under-test can be accurately measured. Additionally, since one data processing section 80 can provided for each of the plurality of measurement channels, the measurement variation in the data processing section 80 can be reduced. Additionally, the FPGA provided in the test apparatus 10 is used as the data processing section 80, so that a circuit layout on the substrate can be facilitated and the substrate design also can be facilitated.

The operation section 122 may calculate the maximum value and the minimum value of the digital pulse width calculated by the pulse width calculating section 82. Additionally, the operation section 122 may further calculate the average value of the digital pulse width calculated by the pulse width calculating section 82.

By performing the above-described processing, the periodic variation of the device-under-signal can be easily evaluated by such as the mainframe 130 and an external electronic calculator. For example, the mainframe 130 may calculate the peak to peak value of the periodic jitter of the signal-under-test based on the difference between the maximum value and the minimum value of the digital pulse width calculated by the operation section 122. Additionally, the mainframe 130 may calculate the standard deviation of the periodic jitter of the signal-under-test based on the average value calculated by the operation section 122.

Figure 3:
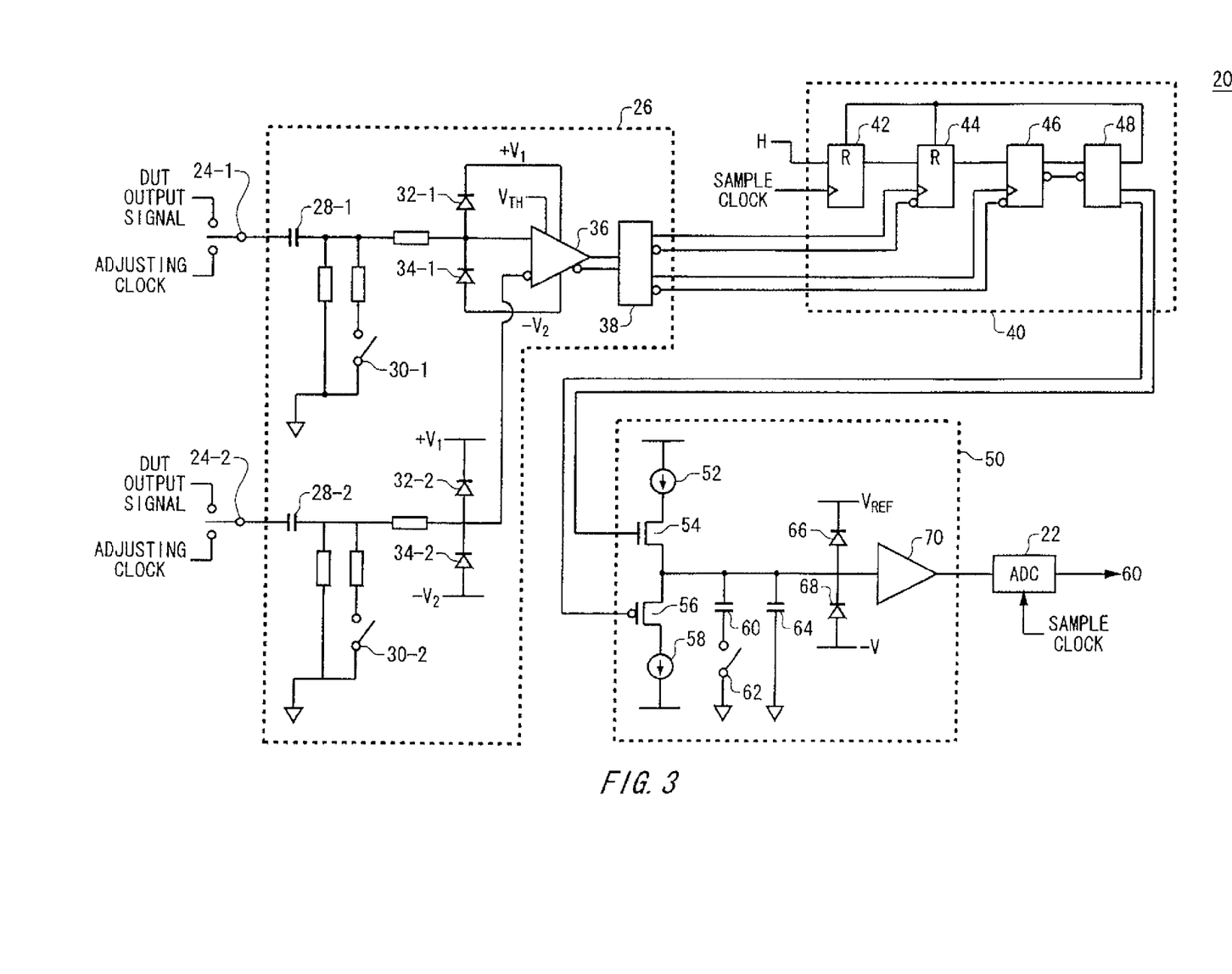
FIG. 3 shows an example of detailed configuration of a circuit for each channel 20.

FIG. 3 shows an example of detailed configuration of a circuit for each channel 20. The circuit for each channel 20 according to the present embodiment further includes a switching sections 24-1 and 24-2 in addition to the components shown in FIG. 2. The circuit for each channel 20 according to the present embodiment receives the differential signal as the output signal. In this case, the input section 26 has a positive side terminal that receives the differential signal at the positive side and a negative side terminal that receives the differential signal at the negative side.

The switching section 24-1 is provided in front step of the positive side terminal in the input section 26. That is, the positive side terminal in the input section 26 receives the differential signal of the positive side which is outputted by the device under test 200 through the switching section 24-1.

The switching section 24-2 is provided in front step of the negative side terminal in the input section 26. That is, the negative side terminal in the input section 26 receives the differential signal of the negative side outputted from the device under test 200 through the switching section 24-2.

Additionally, each of the switching sections 24 selects either of the output signal from the device under test 200 and the adjusting clock outputted by the adjusting clock generating section 90, and inputs the same to the input section 26. For example, when the adjusting section 86 measures the characteristic of the circuit for each channel 20, each of the switching sections 24 selects the adjusting clock and inputs the same to the input section 26. Additionally, when the adjusting section 86 measures the output signal from the device under test 200, each of the switching section 24 selects the output signal and inputs the same to the input section 26.

The input section 26 has condensers 28, switches 30, diodes 32, diodes 34, a comparison circuit 36 and an output circuit 38. The condensers 28, the switches 30, diodes 32 and diodes 34 are provided for each of the positive side terminal and the negative side terminal.

The condenser 28 filters the de component of the signal provided from the switching section 24. The signal filtered through the condensers 28 is inputted to the comparison circuit 36. Additionally, the transmission path between the condensers 28 and the comparison circuit 36 is divided into transmission paths having a predetermined impedance and connected to ground. The switch 30 switches the impedances of the divided transmission paths. Thereby the impedances in the transmission paths from the condensers 20 to the comparison circuit can be matched with each other.

The diodes 32 and the diodes 34 limit the voltage value of the signal transmitted through the transmission path from the condensers 28 to the comparison circuit 36. For example, the diodes 32 are provided between the transmission path and a predetermined high level wiring (+V) to prevent the level of the signal transmitted through the transmission path from being higher than the predetermined value. Meanwhile, the diodes 34 are provided between the transmission path and a predetermined low level wiring (−V2) to prevent the level of the signal transmitted through the transmission path from being lower than the predetermined value. Thereby the absolute value of the level of the signal transmitted through the transmission path can be limited, so that the comparison circuit can be prevented from being damaged.

The comparison circuit 36 compares the level of the inputted signal with the predetermined reference level (VTH) and outputs the comparison results. The output circuit may be a LVPECL (Low Voltage Positive Emitter Coupled Logic) circuit. The output circuit 38 provides the signal outputted by the comparison circuit 36 to the periodic pulse generating section 40. The signals outputted by the comparison circuit 36 and the output circuit 38 may be differential signals.

The periodic pulse generating section 40 includes a plurality of flip flops which are cascade-connected. The periodic pulse generating section 40 according to the present embodiment includes a first flip flop 42, a second flip flop 44, a third flip flop 46 and an output circuit 48.

The first flip flop 42 receives a predetermined logic value as a data input, loads the data input according to the sample clock provided from the sample clock generating section 84 and outputs the same. The first flip flop 42 according to the present embodiment receives a fixed 'H' logic signal as the data input. Additionally, the output of the first flip flop 42 is reset in response to the output signal of the third flip flop 46. In the present embodiment, when the output signal of the third flip flop 46 is transferred to 'H' logic, the output of the first flip flop 42 is reset.

The second flip flop 44 receives the output signal of the first flip flop 42 as a data input, loads the data input in response to the signal-under-test outputted by the input section 26 and outputs the same. In the present embodiment, the input section 26 inputs the differential signal of the signal-under-test to a differential clock terminal of the second flip flop 44. The output of the second flip flop 44 is reset in response to the output signal of the third flip flop.

The third flip flop 46 receives the output signal of the second flip flop 44 as a data input, loads the data input in response to the signal-under-test outputted by the input section 26 and outputs the same as a periodic pulse. In the present embodiment, the input section 26 inputs the differential signal of the signal-under-test to the differential clock terminal of the second flip flop 44. Here, the signal-under-tests inputted to the differential clock terminals of the second flip flop 44 and the third flip flop 46 may have the same phase.

The output circuit 48 receives the periodic pulse outputted by the third flip flop 46 and outputs the same to the converting section 50. The output circuit 48 may includes the function and the configuration the same as those of the output circuit 38 in the input section 26.

Additionally, the output circuit 48 provides the periodic pulse outputted by the third flip flop 46 to reset terminals of the first flip flop 42 and the second flip flop 44. It is preferred that the transmission path from the output circuit 48 to the reset terminals of the first flip flop 42 and the second flip flop 44 of which wire length is short as possible. For example, it is preferred that the amount of delay for the transmission path is sufficiently shorter than one period of the signal-under-test. An example of operation of the periodic pulse generating section 40 will be described later with reference to FIG. 4.

The converting section 50 includes a source side current source 52, a source side transistor 54, a sink side current source 58, a condenser 60, a switch 62, a condenser 64, a diode 66, a diode 68 and an amplifier 70.

The source side transistor 54 and the sink side transistor 56 of which gate terminals receive the periodic pulses outputted by the periodic pulse generating section 40. Here, the polarity of the source side transistor is reversed to that of the sink side transistor 56. For example, one is a N-channel transistor and the other is a N-channel transistor. Thereby when the source side transistor is in on-state, the sink side transistor 56 is in off-state. Alternatively, the source side transistor 54 is in off-state, the sink side transistor 56 is in on-state.

The source side current source 52 is provided between a predetermined positive electric potential and a drain terminal of the source side transistor 54. When the source side transistor 54 is in on-state, the source side current source 52 charges the condenser 60 and the condenser 64 with a predetermined source current. The sink side current source 58 is provided between a predetermined negative electric potential and a source terminal of the sink side transistor. When the sink side transistor 56 is in on-state, the sink side current source 58 discharges the condenser 60 and the condenser 64 with a predetermined sink current. Thereby the voltages of the condenser 60 and the condenser 64 are in the level according to the width of the periodic pulse.

The switch 62 switches whether the condenser 60 is connected to ground. That is, the switch 62 is in off-state, so that the voltage of the condenser 60 can be held. Thereby the AD converter 22 can easily detect the voltage of the condenser 60.

The diode 66 and the diode 68 limit the voltage level inputted to the amplifier 70. The amplifier 70 amplifies the voltages of the condenser 60 and the condenser 64 at a predetermined amplification factor and inputs the same to the AD converter 22.

Figure 4:
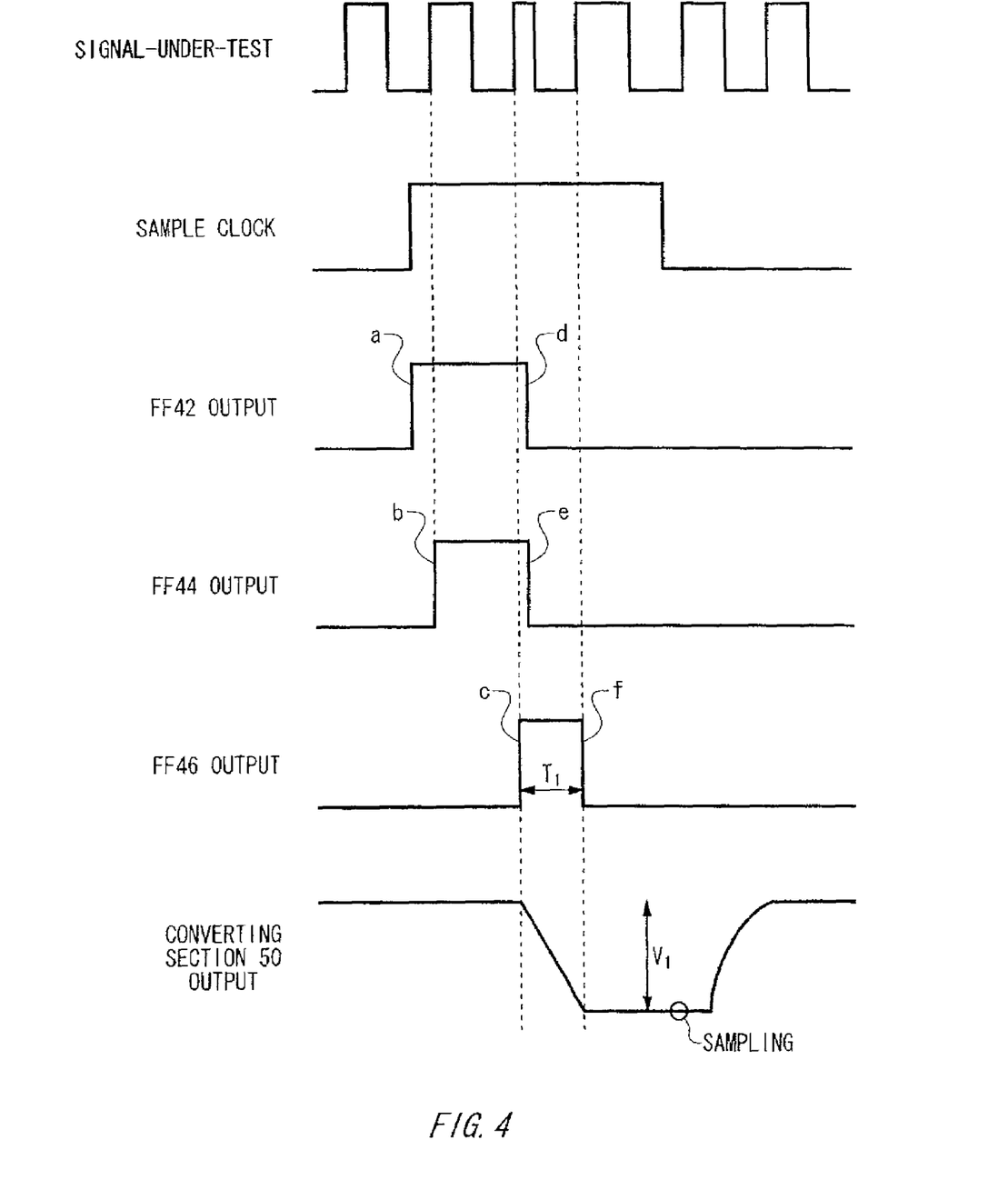
FIG. 4 shows an example of operation of a periodic pulse generating section 40 and a converting section 50.

FIG. 4 shows an example of operation of a periodic pulse generating section 40 and a converting section 50. As described above, "H" logic is inputted to the data input of the first flip flop 42. Therefore, the output of the first flip flop 42 is transferred from the "L" logic to "H" logic in response to the leading edge of the provided sample clock shown as a in FIG. 2.

The second flip flop 44 loads the output of the first flip flop 42 in response to the leading edge of the signal-under-test and outputs the same. Therefore, the output of the second flip flop 44 is transferred from "L" logic to "H" logic in response to the leading edge of the signal-under-test immediately after the output of the first flip flop 42 is transferred to "H" logic shown as b in FIG. 4.

The third flip flop 46 loads the output of the second flip flop 44 in response to the leading edge of the signal-under-test and outputs the same. Therefore, the output of the third flip flop 46 is transferred from "L" logic to "H" logic in response to the leading edge of the signal-under-test immediately after the output of the second flip flop 44 is transferred to "H" logic shown as c-FIG. 4.

Then, when the output of the third flip flop 46 indicates "H" logic, the outputs of the first flip flop 42 and the second flip flop 44 are reset Therefore, the outputs of the first flip flop 42 and the second flip flop 44 are transferred to "L" logic after a predetermined propagation delay since the output of the third flip flop 46 indicates "H" logic shown as d and e in FIG. 4.

Then, the output of the third flip flop 46 is transferred to the "L" logic in response to the leading edge of the signal-under-test immediately after the output of the second flip flop is transferred to "L" logic shown as f in FIG. 4. Thereby the periodic pulse generating section 40 detects the period for a cycle of the signal-under-test designated by the sample clock.

The converting section 50 integrates the periodic pulse outputted by the third flip flop 46. The output level V1 of the converting section 50 corresponds to a length T1 of a predetermined cycle of the signal-under-test. Then, the switch 62 is turned off, so that the output of the converting section 50 is held to V1. The AD converter 22 converts the output level V1 to a digital value at the timing of the sample clock. For example, the AD converter 22 may detect the output level of the converter 50 in response to the leading edge of the sample clock. After detecting the output level of the converting section 50, the AD converter 22 controls the switch 62 to turn on to discharge the condenser 60. Additionally, AD converter 22 controls the switch 62 to turn off in response to the trailing edge of the output of the third flip flop 46.

The sample block generating section 84 may generate a sample clock having the pulse width larger than three periods of the signal-under-test, for example. Additionally, the sample clock generating section 84 may designate any number of cycles of the signal-under-test. In this case, the sample clock generating section 84 generates a sample clock having the designated number of pulses. Here, each pulse generated by the sample clock generating section 84 may be arranged at even intervals, or may be arranged at uneven intervals. It is preferred that the interval between each pulse of the sample clock is larger than a time for which the output of the converting section 50 returns to the initial value since the output is changed in response to the output of the third flip flop 46.

Figure 5:
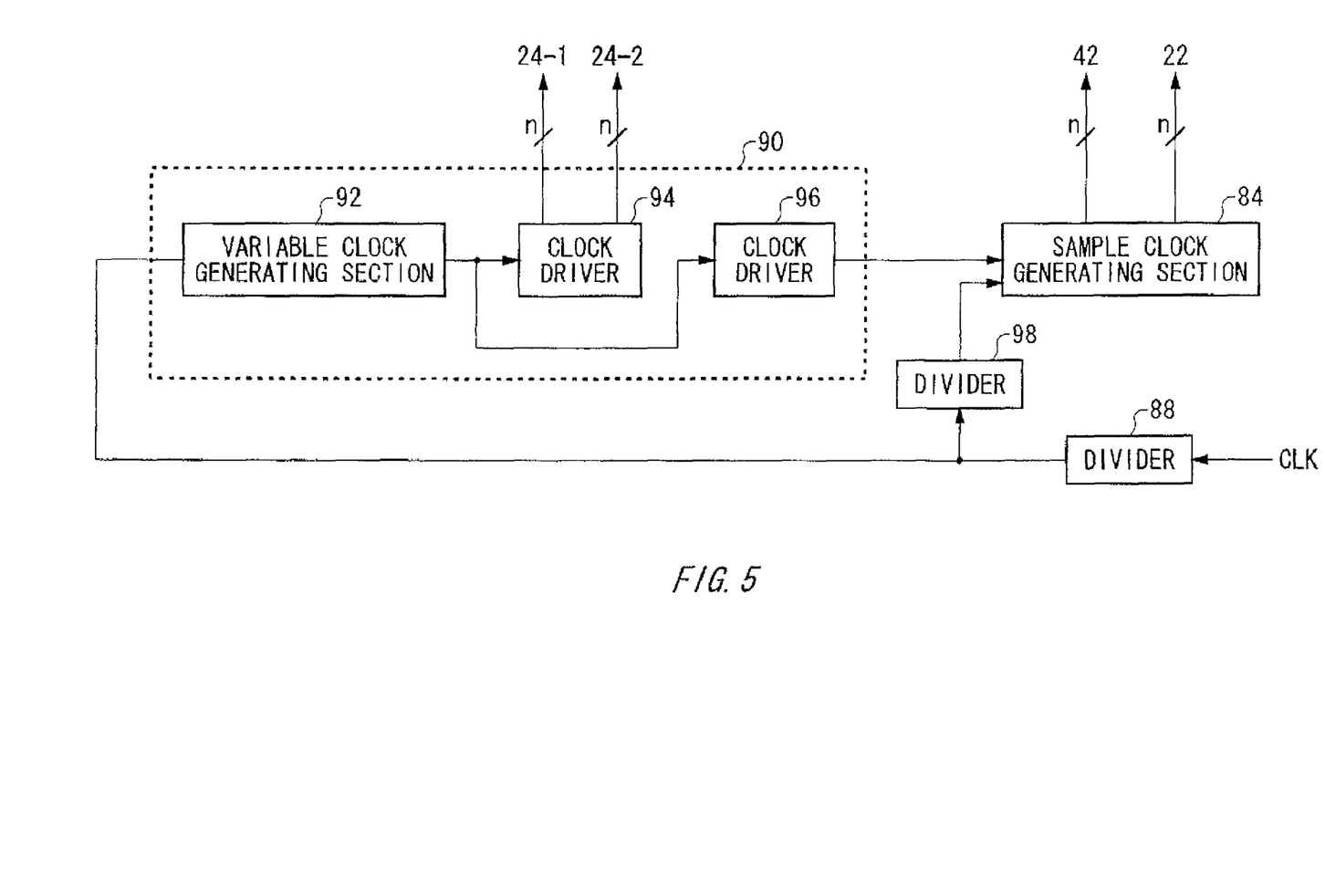
FIG. 5 shows an example of configuration of an adjusting clock generating section 90.

FIG. 5 shows an example of configuration of an adjusting clock generating section 90. Here, the measurement circuit 12 further includes a divider 88 and a divider 98 in addition to the components shown in FIG. 2.

The divider 88 receives a predetermined clock signal, divides the same at a predetermined division ratio and outputs the same. For example, the divider 88 may receive a system clock of the test apparatus 100. The test apparatus 100 may further include a clock generating device which generates a clock signal provided to the divider 88.

The adjusting clock generating section 90 receives a divided clock outputted by the divider 88. The adjusting clock generating section 90 includes a variable clock generating section 92, a clock driver 94 and a clock driver 96.

The variable clock generating section 92 generates a clock signal having any frequency based on the divided clock outputted by the divider 88. For example, the variable clock generating section 92 may generate a clock signal having any frequency by using a PLL circuit, a fractional PLL circuit and a frequency multiplying circuit.

The clock driver 94 provides a clock signal outputted by the variable clock generating section 92 as an adjusting clock signal to the switching section 24. When there are n circuit for each channels 24, the clock driver 94 provides the adjusting clock signals to n switching sections 24.

The clock driver 92 provides the clock signal generated by the variable clock generating section 92 to the sample clock generating section 84. The divider 98 further divides the divided clock signal outputted by the divider 88 and provides the same to the sample clock generating section 84.

The sample clock generating section 84 generates a sample clock based on either of the clock signal received from the divider 98 or the clock signal received from the clock driver 96. The sample clock generating section 84 may provide the same sample clock to the first flip flop 42 and the AD converter 22. When there are n circuit for each channels 20, the sample clock generating section 84 provides the sample clocks to n first flip flops 42 and n AD converters 22.

Thereby the adjusting clock signal and the sample clock can be generated at a desired period.

Figure 6:
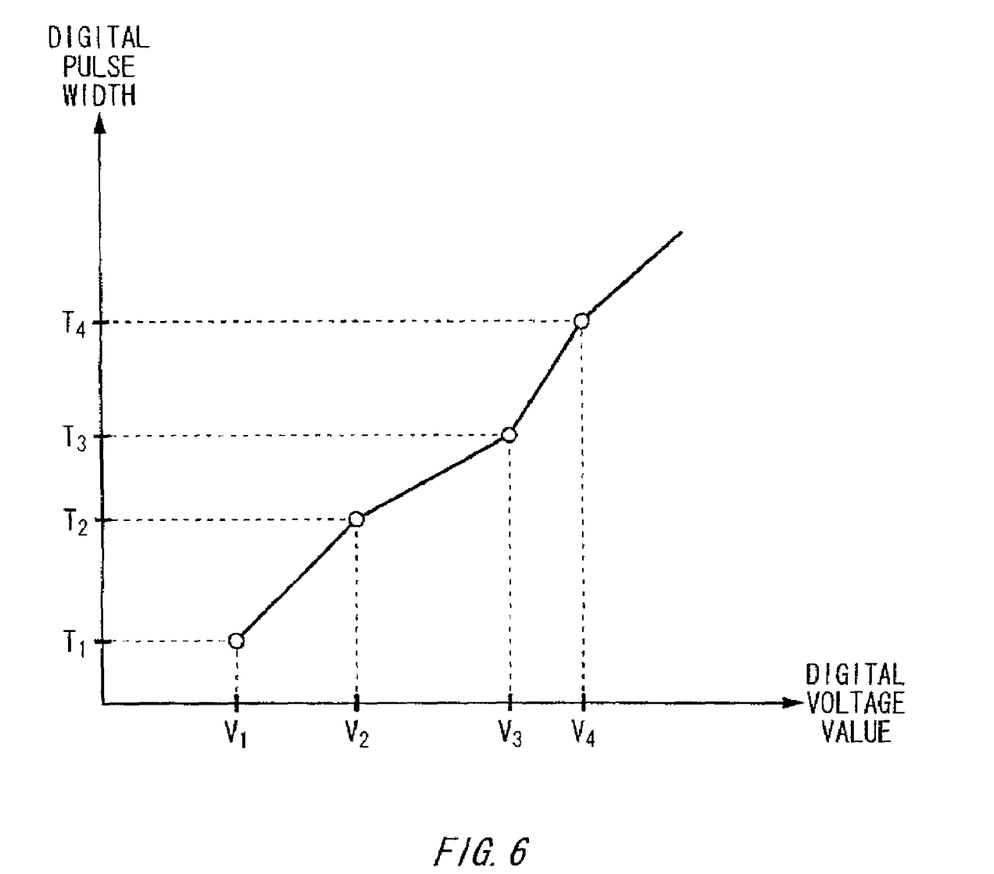
FIG. 6 shows an example of operation of an adjusting section 86.

FIG. 6 shows an example of operation of an adjusting section 86. Firstly, the adjusting section 86 causes the adjusting clock generating section 90 to output an adjusting clock signal having a known frequency. For example, the adjusting section 86 causes the adjusting clock generating section 90 to sequentially output adjusting clock signals having frequency T1, T2, T3 and T4, respectively. It is preferred that the adjusting clock signal of which jitter is sufficiently reduced.

Next, the adjusting section 86 detects a digital voltage value outputted by the AD converter 22 for each of the adjusting clock signals. In the present embodiment, the AD converter 22 outputs digital voltage values V1, V2, V3 and V4 for the adjusting clock signals each of which frequency is T1, T2, T3 and T4.

The adjusting section 86 associates each of the digital voltage value V1, V2, V3 and V4 with each digital value of which frequency is T1, T2, T3 and T4, respectively. The digital value is a value for the digital pulse width to be calculated for each of the digital voltage values.

The adjusting section 86 may create a table in which the digital voltage values are associated with the digital pulses width as described above. The adjusting section 86 may convert the digital voltage value outputted for the signal-under-test to the digital pulse width with reference to the table.

Additionally, the correspondence between each of the actually measured digital voltage values (V1, V2, V3 and V4) and the digital pulse width may be calculated by linear-interpolating as shown in FIG. 6. For example, the adjusting section 86 may calculate a linear equation to convert the digital voltage value to the digital pulse width for each interval (T1-T2, T2-T3, T3-T4) obtained by dividing the period of the adjusting clock. The linear equation can be easily calculated based on the digital voltage value and the digital pulse width at both ends of each interval.

The adjusting section 86 may calculate coefficients and constants of the linear expression and store therein the same. Additionally, the adjusting section 86 may calculate coefficients and constants of corresponding linear expression every interval obtained by dividing the period of the adjusting clock and store therein the same. The pulse width calculating section 82 converts the digital voltage value to the digital pulse value by using the linear expression calculated by the adjusting section 86.

As evidenced by the above description, the measurement difference for each channel can be compensated according to one embodiment of the present invention. Additionally, a substrate on which various circuits are provided can be easily designed by using the FPFGA as the data processing section 80.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

What is claimed is:

1. A test apparatus that tests a device under test, comprising:
   a signal provision section that provides a test signal to a device under test;
   an input section that inputs the output signal outputted from the device under test in response to the test signal as a signal-under-test;
   a periodic pulse generating section that generates a periodic pulse having a pulse width corresponding to one cycle of the signal-under-test;
   a converting section that outputs a voltage corresponding to the width of periodic pulse;
   an AD converter that converts a voltage to a digital voltage value;
   a pulse width calculating section that calculates a digital pulse width indicative of the width of the periodic pulse based on the digital voltage value; and an adjusting section that adjusts a conversion parameter that converts between the digital voltage value and the digital pulse width.

2. The test apparatus as set forth in claim 1 further comprising:
an adjusting clock generating section that outputs a plurality of adjusting clocks each of which frequency is different from each other; and
a switching section that inputs the plurality of adjusting clocks instead of the output signal to the input section,
the adjusting section sets the conversion parameter to the plurality of adjusting clock such that if the adjusting clocks are inputted to the input section, the measured digital voltage value is converted to the digital pulse width corresponding to one period of the adjusting clock.

3. The test apparatus as set forth in claim 2, wherein
the pulse width calculating section outputs the result obtained by calculating a linear expression of the digital voltage value as the digital pulse width,
the adjusting section determines a coefficient and a constant of the linear expression based on the digital voltage value measured corresponding to each of the plurality of adjusting clocks and the period for each of the plurality of adjusting clocks, and sets the same as the conversion parameter.

4. The test apparatus as set forth in claim 3, wherein
the pulse width calculating section stores the coefficient and the constant of the linear expression to convert the digital voltage to the digital pulse width for each interval obtained by dividing the period of the signal-under-test, and
the adjusting section determines the coefficient and the constant of the linear expression based on the digital voltage value measured corresponding to each of more that two adjusting clocks for each interval and the period for each of more than two adjusting clocks, and sets the same as the conversion parameter.

5. The test apparatus as set forth in claim 2 further comprising an operation section that calculates the maximum value and the minimum value of the digital pulse width outputted by the pulse width calculating section.

6. The test apparatus as set forth in claim 5, wherein the operation section further includes the average value of the digital pulse width outputted by the pulse width calculating section.

7. The test apparatus as set forth in claim 1, wherein
the periodic pulse generating section has a first flip flop, a second flip flop and a third flip flop which are cascade-connected,
the first flip flop receives a predetermined logical value as a data input, loads the data input in response to the sample clock, outputs the same and resets the output in response to the output signal of the third flip flop,
the second flip flop receives the output signal of the first flip flop as a data input, loads the data input in response to the signal-under-test, outputs the same and resets the output in response to the output signal of the third flip flop, and
the third flip flop receives the output signal of the second flip flop as a data input, loads the data input in response to the signal-under-test and outputs the same as the periodic pulse.

8. The test apparatus as set forth in claim 1 includes a plurality of the input sections, a plurality of the periodic pulse generating sections, the plurality of the converting sections, a plurality of the AD converters and a plurality of the switching sections corresponding to each of the plurality of output signals outputted by a plurality of output terminals of the device under test,
the pulse width calculating section, the adjusting clock generating section and the adjusting section are provided as a common circuit common to the plurality of output signals.

9. A test module provided in a test head of a test apparatus that tests a device-under-test, comprising:
an input section that inputs an output signal outputted from the device under test through a mother board placed on the test head as a signal-under-test;
a periodic pulse generating section that generates a periodic pulse having a pulse width corresponding to one cycle of the signal-under-test;
a converting section that outputs a voltage corresponding to the width of periodic pulse;
an AD converter that converts a voltage to a digital voltage value;
a pulse width calculating section that calculates a digital pulse width indicative of the width of the periodic pulse based on the digital voltage value; and
an adjusting section that adjusts a conversion parameter that converts between the digital voltage value and the digital pulse width.

10. A test head of a test apparatus that tests a device under test, comprising:
a circuit-for-each-channel, which is connected to the device under test, and outputs a digital value corresponding to one cycle of an output signal outputted from the device under test;
a data processing section which is connected to an output of the circuit-for-each-channel, and converts the digital value to a digital pulse width indicative of one cycle of the signal-under-test; and
an adjusting section which adjusts a conversion parameter that converts between the digital value and the digital pulse width.

11. The test head as set forth in claim 10, wherein the circuit-for-each-channel includes:
an input section which inputs the output signal outputted from the device under test as a signal-under-test;
a periodic pulse generating section which is connected to an output of the input section, and generates a periodic pulse having a pulse width corresponding to one cycle of the signal-under-test, in response to a sample clock that designates a timing at which the signal-under-test is sampled;
a converting section which is connected to an output of the periodic pulse generating section, and outputs an analog voltage corresponding to the width of the periodic pulse; and
an AD converter which is connected to an output of the converting section, and converts the analog voltage to the digital value.

12. The test head as set forth in claim 10, further comprising:
an adjusting clock generating section which outputs a plurality of adjusting clocks having frequencies different from each other; and
a switching section which inputs the plurality of adjusting clocks instead of the output signal to the circuit-for-each-channel,
wherein the adjusting section sets the conversion parameter for the plurality of adjusting clocks such that the digital value, which is to be output as a result of inputting the adjusting clocks to the circuit-for-each-channel, is to be converted to the digital pulse width corresponding to one cycle of the adjusting clocks.

13. The test head as set forth in claim 10, further comprising a signal provision section which provides a test signal to the device under test.

14. The test head as set forth in claim 10, comprising a plurality of circuits-for-each-channel corresponding to a plurality of output signals outputted from a plurality of output terminals of the device under test, respectively,
   wherein the data processing section is provided as a common circuit common to the plurality of output signals.

15. A test module provided in a test head of a test apparatus that tests a device under test, comprising:
   a circuit-for-each-channel which is connected to the device under test and outputs a digital value corresponding to one cycle of a signal-under-test outputted from the device under test; and
   a data processing section which is connected to an output of the circuit-for-each-channel and converts the digital value to a digital pulse width indicative of one cycle of the signal-under-test,
   wherein the data processing section includes an adjusting section which adjusts a conversion parameter that converts between the digital value and the digital pulse width.

* * * * *